US006587061B2

(12) United States Patent
Petrofsky

(10) Patent No.: US 6,587,061 B2
(45) Date of Patent: Jul. 1, 2003

(54) ANALOG COMPUTATION CIRCUITS USING SYNCHRONOUS DEMODULATION AND POWER METERS AND ENERGY METERS USING THE SAME

(75) Inventor: Joseph G. Petrofsky, Los Gatos, CA (US)

(73) Assignee: Linear Technology Corporation, Milpitas, CA (US)

( * ) Notice: Subject to any disclaimer, the term of this patent is extended or adjusted under 35 U.S.C. 154(b) by 30 days.

(21) Appl. No.: 09/898,245

(22) Filed: Jul. 3, 2001

(65) Prior Publication Data

US 2003/0080886 A1 May 1, 2003

(51) Int. Cl.[7] ................................................ H03M 3/00

(52) U.S. Cl. ....................... 341/143; 327/348; 364/807; 341/144

(58) Field of Search ................................ 341/155, 143, 341/144, 145, 156; 327/348; 364/481, 483, 807

(56) References Cited

U.S. PATENT DOCUMENTS

| | | | | |
|---|---|---|---|---|
| 5,150,324 | A | 9/1992 | Takasuka et al. | 364/807 |
| 5,867,054 | A | 2/1999 | Kotowski | 327/513 |
| 5,896,056 | A | 4/1999 | Glucina | 327/348 |
| 6,285,306 | B1 | 9/2001 | Zrilic | 341/143 |

OTHER PUBLICATIONS

F. Op 't Eynde, "TP 11.1: A Power Metering ASIC with a Sigma–Delta–Based Multiplying ADC," 1994 IEEE International Solid–State Circuits Conference, Digest of Technical Papers, IEEE Catalog No. 94CH3410–8, Feb. 1994, pp. 1,2,8, 186, 187, and 335.

F. Op 't Eynde, "TP 11.1: A Power Metering ASIC with a Sigma–Delta–Based Multiplying ADC," 1994 IEEE International Solid–State Circuits Conference, 1994 ISSCC Slide Supplement, 1994, pp. 146, 137, and 289.

Baturone et al., "CMOS Design of Current–Mode Multiplier/Divider Circuit with Applications to Fuzzy Controllers," *Analog Integrated Circuits and Signal Processing*, vol. 23, No. 3, Jun. 2000, pp. 199–210.

"Chipset Solution for Watt–hour Meters: AT73C500 with AT73C501 or AT73C502," *Atmel Corporation*, Sep. 1999, pp. 1–31.

(List continued on next page.)

*Primary Examiner*—Brian Young
*Assistant Examiner*—John Nguyen
(74) *Attorney, Agent, or Firm*—Fish & Neave; Andrew Van Court

(57) ABSTRACT

The present invention relates to analog computation circuits that use a synchronous demodulator topology which can be configured to perform arithmetic computation, power measurements, and/or energy measurement of various analog signals. The computation circuits have circuitry that generates an output signal based on the values of a first input signal, a second input signal, and a reference signal. This invention provides accurate computation of two signals by using modulation circuitry (e.g., Δ-Σ modulation circuitry), demodulation circuitry (e.g., multiplying digital-to-analog converters), delay circuitry, and output circuitry.

41 Claims, 10 Drawing Sheets

OTHER PUBLICATIONS

Dan Harres, "Delta–sigma analog–to–analog converter solves tough design problems," *EDN*, Apr. 27, 1995, pp. 111–124.

Jeff Kotowski and Alan Johnston, "Power meter uses low––cost multiplier," *EDN*, Dec. 23, 1999, p. 110.

Jeff Kotowski et al., "Current Sensor IC Provides 9 bit + Sign Result without External Sense Resistor," from *IEEE 1998 Custom Integrated Circuits Conference*, pp. 35–38.

"LM3812/LM3813 Current Gauge IC with Ultra Low Loss Sense Element and PWM Output," *National Semiconductor publication DS100122*, Jul. 1998, pp. 1–16.

"Power Meter Tutorial," *Yokogawa Electric Corporation*, 1994–2001, <http://www.yokogawa.com/tm/T/> (printed on Jul. 16, 2001).

"Product–to–Frequency Converter: AD7750," *Analog Devices, Inc.*, 1997, pp. 1–16.

Daniel H. Sheingold ed., "Non–linear Circuits Handbook 2nd ed.", *Analog Devices*, 1976, pp. 203–326.

"Single Phase Bi–Directional Power/Energy IC: CS5460," *Cirrus Logic*, Jul. 2000, pp. 1–35.

C. Toumazou et al., "Analogue IC Design: The Current––Mode Approach," 1990, pp. 53–91.

Petrofsky U.S. patent application No. 09/411,150, filed Oct. 1, 1999.

Petrofsky U.S. patent application No. 09/735,331, filed Dec. 12, 2000.

ANALOG COMPUTATION CIRCUITS USING SYNCHRONOUS DEMODULATION AND POWER METERS AND ENERGY METERS USING THE SAME

BACKGROUND OF THE INVENTION

The present invention relates to methods and apparatus for computation circuits, power and energy measuring circuits, and more particularly to analog computation circuits, power meters, and energy meters that use a synchronous demodulation topology.

Computation circuits may determine a product or ratio of two or more analog signals while maintaining proper units. Traditional computational circuits such as multiplier/divider circuits, may use a variety of methods to perform circuit computations. Such methods may use the logarithmic characteristic of the current versus voltage (I-V) curve of the bipolar transistor $V_{be}$-$I_c$ or the square-law characteristic of the MOSFET $V_{gs}$-$I_d$ relationships to implement multiplier/divider circuits. Both methods may have inherent accuracy limitations in performing computations because of their dependence upon $V_{be}/V_{gs}$ control voltages. These control voltages are often relatively low voltages that can be subjected to variations (e.g., thermal changes, transients, noise, or the like) which may hinder the computation circuit's computational accuracy.

Some multiplier/divider circuits have departed from the traditional computational circuit methods, such as the multiplier/divider circuit described in U.S. Pat. No. 5,150,324 to Takasuka et al., the disclosure of which is incorporated by reference in its entirety (hereinafter "Takasuka"). FIG. 1 illustrates a simplified version of Takasuka's FIG. 1. Takasuka circuit 100, as shown in FIG. 1, may be configured to perform multiplication, division, or other computations. This circuit may use a delta-sigma modulator 130, which has analog inputs $V_1$ and $V_{REF}$. Modulator 130 may generate a digital output signal (e.g., duty cycle) based on a ratio having $V_1$ inversely proportional to $V_{REF}$. This digital output signal (ratio) can be used as an input for multiplying digital-to-analog converter 151 (MDAC 151). MDAC 151 may also receive a second input signal, which is shown as $V_2$. MDAC 151 may generate a signal by multiplying the digital output signal with the second input signal at $V_2$. The result may be filtered by lowpass filter 160 to produce output $V_{OUT}$, which may be substantially equivalent to $(V_1/V_{REF})*V_2$.

This circuit has significant improvements over the traditional methods, but still has several flaws. One flaw with Takasuka circuit 100 may be that the sampling frequency should be several times higher (e.g., 50–1000 times) than the input frequency of $V_1$. When the frequency of $V_1$ approaches the sampling frequency of clock CLK, modulator 130 may experience amplitude roll-off of the input signal $V_1$. This may result in errors that occur during multiplication of the digital signal and $V_2$ in MDAC 151 because of delays in modulator 130. Since both modulator 130 and MDAC 151 operate at the same clock frequency, any delay in generating the digital signal may result in an erroneous measurement. Takasuka circuit 100 may have another restriction that requires the frequency of $V_{REF}$ to be much lower than the sampling frequency in order to keep modulator 130 stable.

FIG. 2 shows RMS-to-DC converter 200 as described in U.S. Pat. No. 5,896,056 to Glucina, the disclosure of which is incorporated by reference in its entirety. RMS-to-DC converter 200 may include Δ-Σ modulator 230, MDAC 250, lowpass filter 260, rectifier 205 to provide computation of the RMS function. Rectifier 205 may be coupled to receive $V_1$ and $V_2$ and provide an output to both Δ-Σ modulator 230 and MDAC 250. Δ-Σ modulator 230 may generate a digital signal based on the rectifier output and the output of lowpass filter 260, shown as $V_{OUT}$. The output of lowpass filter 260, $V_{OUT}$ may provide a unipolar DC signal that provides Δ-Σ modulator 230 with a stable reference, $V_{REF}$ for generating a digital output signal. This digital output signal may then be multiplied to the rectified signal produced by rectifier 205 to create an analog signal that can be filtered by lowpass filter 260.

The filtered analog product can be accurate, but often times the result is hampered by delays introduced by Δ-Σ modulator 230. Delays introduced by Δ-Σ modulator 230 can degrade the overall accuracy of RMS-to-DC converter 200 because multiplication of the digital output signal and the rectifier output are not synchronous. That is, the multiplication of the digital output signal and the rectifier output in DAC 250 is not based on the same sample time. Furthermore, rectifier 205 may introduce delay errors during rectification of small signals operating at relatively high frequency because of switching transients and voltage drops across the diodes, transistors, etc.

FIG. 3 shows another illustrative embodiment of a RMS-to-DC converter 300 as described in commonly assigned, co-pending, U.S. patent application Ser. No. 09/411,150, filed Oct. 1, 1999, the disclosure of which is incorporated by reference in its entirety. Converter 300 may have Synchronous MASH Modulator/Demodulator (SMMD) circuitry (i.e., pulse code modulator 330, demodulator 350, and delay stages 322 and 324) for performing RMS-to-DC conversion of input signals that have a bipolar input signal range, thus eliminating the need for a performance degrading rectifier. MASH is constituted by a cascade of at least two first order Δ-Σ modulators. Modulator 330 includes cascaded single-sample Δ-Σ stages 332 and 334 and demodulator 350 includes single-bit multiplying digital-to-analog converters (MDAC) stages 352, 354, and 356, and adder/subtractor 358.

SMMD circuitry assures that the multiplication that happens at each MDAC is synchronous; that is both the digital signal generated by the modulator and the delayed analog signal are from the same input sample of $V_{IN}$. The MDACs need not be synchronous with each other, but each one should multiply a digital input with an analog input that is substantially from the same input sample. The products generated by DAC stages 352, 354, and 356 may be summed in adder/subtractor 358. The output of adder/subtracter, shown as $MD_{OUT}$, may be filtered by low pass filter 360 and amplified by gain stage 372 to provide $V_{OUT}$. $V_{OUT}$ may be fed back to gain stage 374 which provides a reference signal for Δ-Σ stages 332 and 334.

Converter 300 may not be limited to having input signals with frequencies less than the sampling frequency of the modulator. In fact, the input frequency may equal or exceed the sampling frequency of the RMS-to-DC converter. This may be possible because the RMS value of an alias of a signal is the same as the RMS value of the signal itself and also because SMMD topology does not corrupt the amplitude vs. frequency response as do all known prior art RMS-to-DC converters using pulse code modulators. The behavior with low over-sampling ratios and even under-sampled waveforms may be further enhanced by the technique of clock dithering as described in commonly assigned, co-pending patent application Ser. No. 09/735,331, filed Dec. 12, 2000, the disclosure of which is incorporated by reference in its entirety.

Power measuring circuits have traditionally been configured with electro-mechanical devices that obtain current by measuring the magnetic field. These meters, however, are expensive and not very cost-effective for use in tiered energy pricing applications or for remote data collection stations.

Other power measuring circuits have been configured to use digital circuits to obtain power and energy measurements. Digital circuits such as the AD7750 manufactured by Analog Devices of Norwood, Massachusetts, and the CS5460 manufactured by Cirrus Logic of Fremont, Calif., have both been used to measure power and energy. These circuits use digitized signals to represent load voltage and current when performing power and energy computations in the digital domain. However, performing such digital calculations can be impractical because a substantial quantity of power is dissipated when obtaining the power or energy measurement.

Another device that can be used for measuring power is described in EDN Magazine, published on Dec. 23, 1999 which discloses the use of U.S. Pat. No. 5,867,054 to Kotowski, both disclosures of which are incorporated by reference in their entirety. Kotowski's circuit may use a pulse-code modulation technique to measure the average power consumed by a load. However, the power measuring circuit disclosed by the EDN article may have limited utility for AC power measurement. This may be because Kotowski's circuit only operates over a portion of the AC power signal. Furthermore, the current signal is delayed considerably by the internal digital filter, which may result in significant power measurement error.

In view of the foregoing, it would be desirable to provide an analog computation circuit that utilizes a synchronous demodulation topology.

It would also be desirable to provide an analog circuit that measures power using a synchronous demodulation topology.

It would be further desirable to provide an analog circuit that measures energy using a synchronous demodulation topology.

SUMMARY OF THE INVENTION

It is therefor an object of this invention to provide an analog computation circuit that utilizes a synchronous demodulation topology.

It is also an object of this invention to provide an analog circuit that measures power by utilizing synchronous demodulation.

It is a further object of this invention to provide an analog circuit that measures energy by utilizing a synchronous demodulation topology.

In accordance with these and other objects of the present invention, analog computation circuits using a synchronous demodulator topology may be configured to perform arithmetic computation, power measurements, and/or energy measurement of various analog signals. The computation circuits, of the present invention, may have circuitry such as modulation circuitry (e.g., Δ-Σ modulation circuitry), demodulation circuitry (e.g., multiplying digital-to-analog converters), delay circuitry, and output circuitry that generates an output signal based on two analog signals and a reference signal.

Analog computation circuits such as computation circuits, power measuring circuits, energy measuring circuits, or any other suitable type of circuit may accurately compute the product of two analog signals based upon the same sample clock signal when these two signals are synchronously multiplied together in the demodulation circuitry. The modulation circuitry may generate a digital output signal of a first analog signal that is inversely proportional to a reference signal.

The generation of this digital output signal may not be an instantaneous process, in fact, there may be delay associated with the generation of the digital output signal. In order to ensure that a second analog signal is synchronously multiplied with the first analog signal, which has been converted to the digital output signal, the second input signal may be delayed to compensate for the delay occurring in the generation of the digital output signal. The demodulation circuitry multiplies the delayed second signal and digital output signal to produce an output signal. Output circuitry may filter the product signal of the demodulation circuitry. The filtered output signal may be proportional to the first and second analog signals and inversely proportional to the reference signal.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF INVENTION

Figure 1:
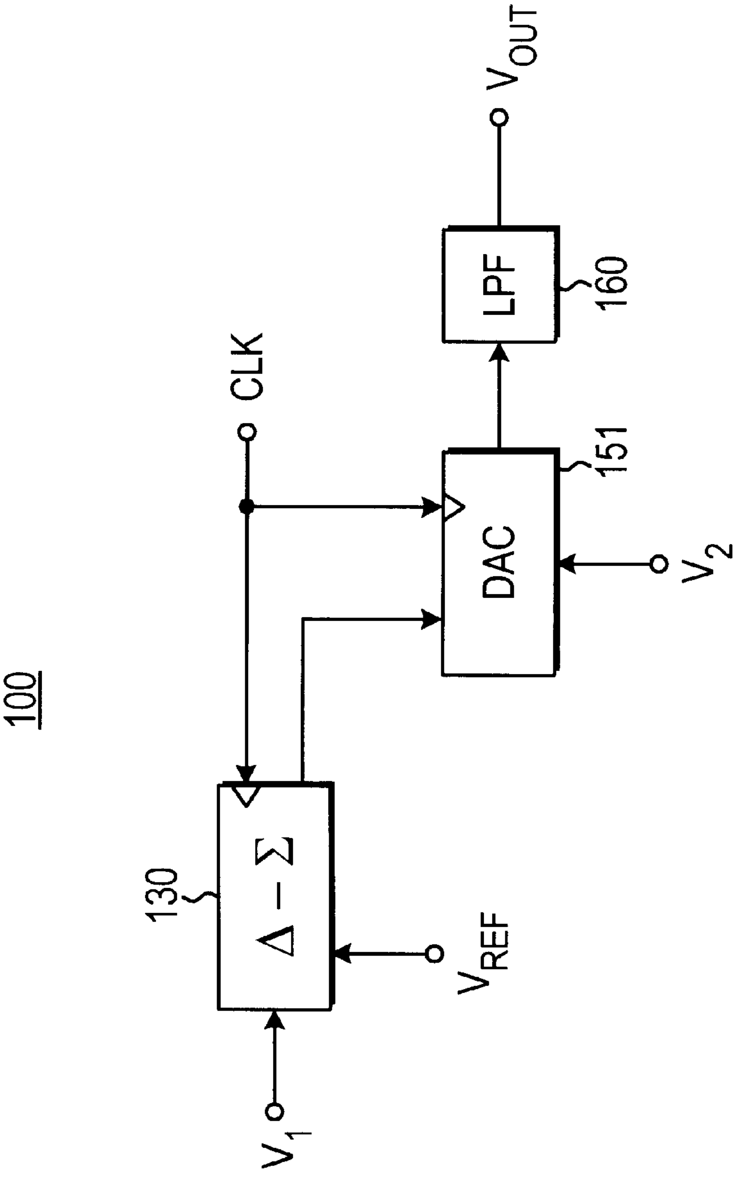
FIG. 1 PRIOR ART
FIG. 1 shows a block diagram of a known analog arithmetic circuit using a Δ-Σ modulator in conjunction with a DAC.
Figure 2:
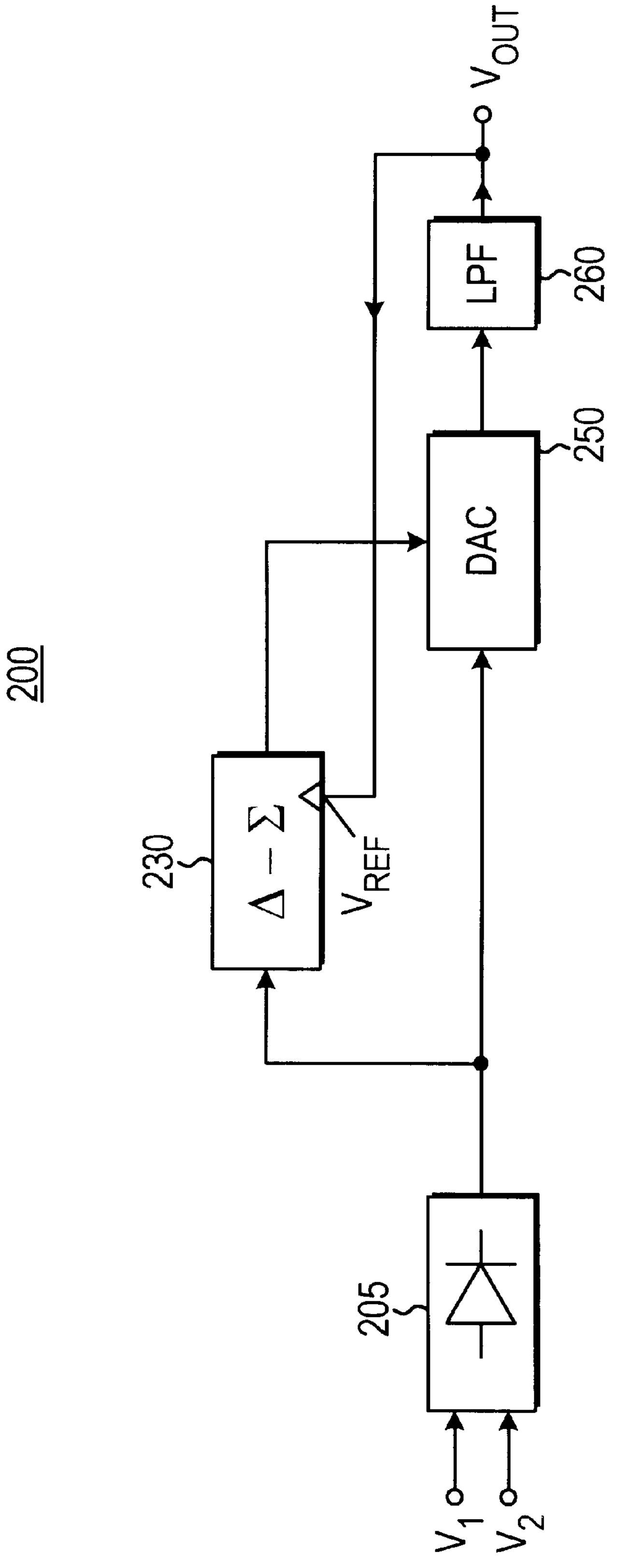
FIG. 2 PRIOR ART
FIG. 2 shows a block diagram of a known analog arithmetic circuit using RMS-to-DC circuitry.
Figure 3:
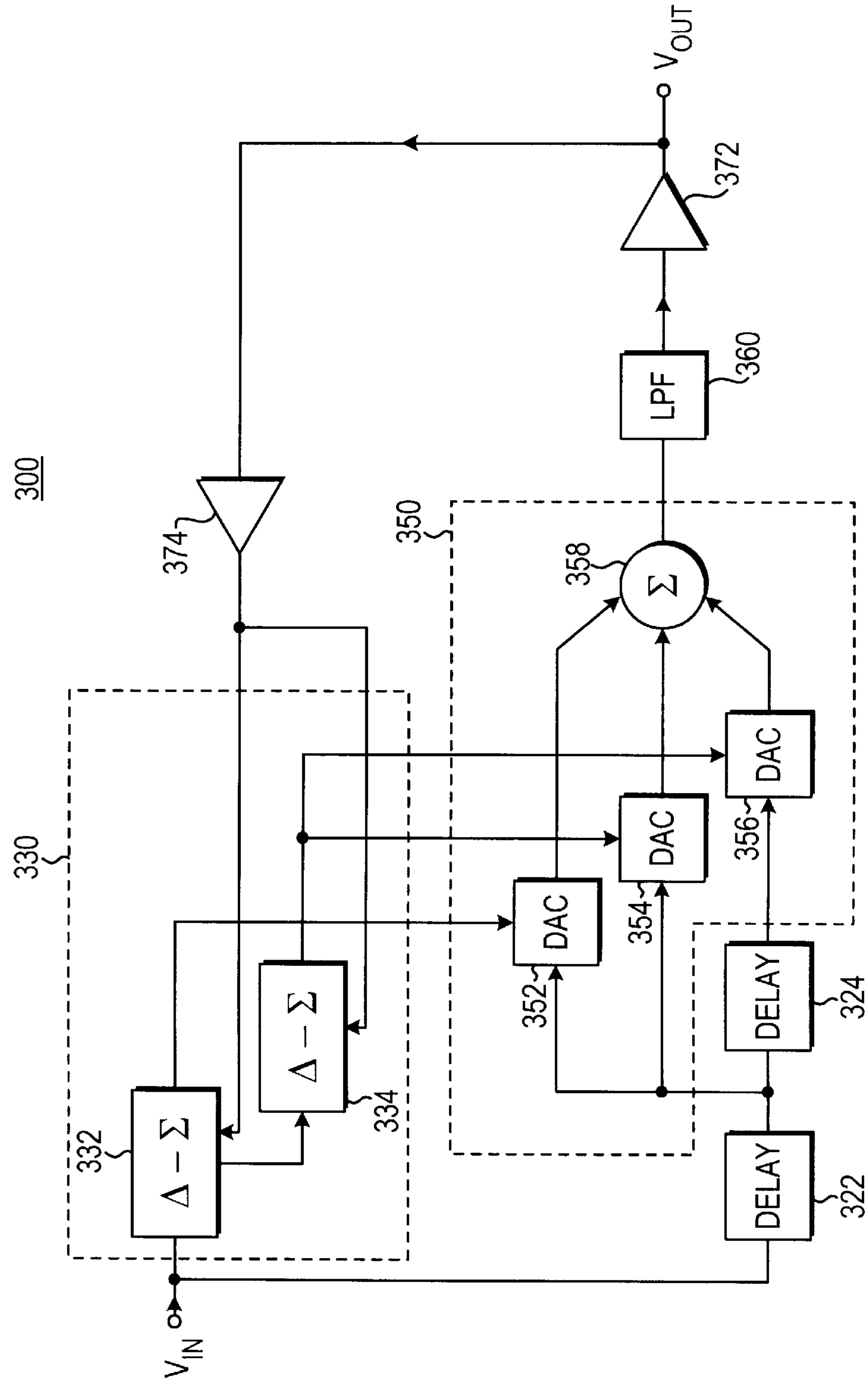
FIG. 3 PRIOR ART
FIG. 3 shows a schematic diagram of a known RMS-to-DC converter using a synchronous mash modulator/demodulator topology.
Figure 4:
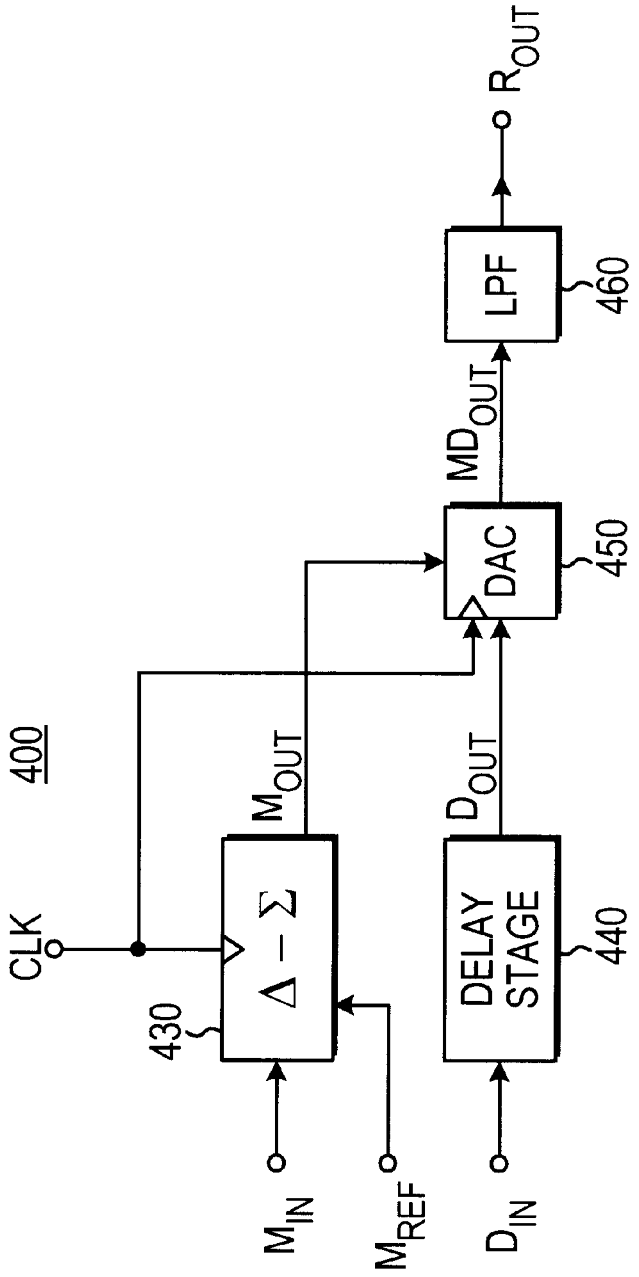
FIG. 4 shows a block diagram of an analog computation circuit constructed in accordance with the present invention.

FIG. 4 shows a generalized block diagram of an analog computation circuit 400 (ACC 400). ACC 400 includes modulator 430, delay stage 440, demodulator 450, lowpass filter 460, and clock CLK. Modulator 430 has a first input coupled to $M_{IN}$, a second input coupled to $M_{REF}$a third input coupled to clock CLK, and an output $M_{OUT}$. Delay stage 440 has input coupled to $D_{IN}$ and output $D_{OUT}$. Demodulator 450 has first input coupled to $M_{OUT}$, second input coupled to $D_{OUT}$, a third input coupled to Clock CLK, and output $MD_{OUT}$. Lowpass filter 460 has input coupled to $MD_{OUT}$ and output $R_{OUT}$.

Modulator 430 may be a pulse code modulator, pulse width modulator, or other similar modulator. In particular, modulator 430 may be implemented as a single-bit oversampling Δ-Σ pulse code modulator. Inputs $M_{IN}$, $M_{REF}$, and $D_{IN}$ may represent any type of physical signal such as current, voltage, power, charge, etc. $M_{REF}$ may be a signal generated independent of ACC 400 or it may be a signal generated within ACC 400 (e.g., a feedback signal such as $R_{OUT}$). The output signal $M_{OUT}$ of modulator may be a pulse code modulator signal having a duty ratio of $M_{IN}$ versus $M_{REF}$:

$$M_{OUT} = \frac{M_{IN}}{M_{REF}} \tag{1}$$

Hence modulator 430 can be used to perform the division function for the analog computation circuit.

The output signal $M_{OUT}$ of Modulator 430 may, for example, comprise a stream of binary pulses, wherein each pulse is a binary signal (e.g., a digital signal having values LOW and HIGH) having a fixed pulse period. The duty ratio over a predetermined interval (e.g., 10 pulse periods) equals the ratio of the number of pulses having a value HIGH during that interval to the total number of pulse periods during that interval. Thus, for example, if a pulse stream contains 4 pulses having a value HIGH during an interval of 10 pulse periods, the duty ratio equals 4/10=40%.

To achieve accurate analog computations, modulator 430 may be implemented using an oversampling cascaded Δ-Σ pulse code modulator. A cascaded Δ-Σ modulator, sometimes referred to as a MASH, advantageously provides good linearity and accuracy, which is set by oversampling ratios. Cascaded Δ-Σ modulators may also allow the frequencies of $M_{IN}$ and $D_{IN}$ to exceed the sampling frequency set by clock CLK.

Clock CLK is a fixed period clock that may have a high frequency for setting the sampling ratio, which may dictate the rate (e.g., frequency) at which input signals are sampled relative to the frequency of the input signal. The clock frequency should have a higher frequency than the frequency of $M_{REF}$ to ensure proper operation of modulator 430. If $M_{IN}$ or $D_{IN}$ frequencies exceed the clock CLK frequency, ACC 400 may generate an uncorrupted (i.e., uncorrupted amplitude vs. frequency signal) signal since synchronous demodulation is used. Modulator 430 may also be implemented using undersampled cascaded Δ-Σ modulators or even low oversampled Δ-Σ cascaded modulators by implementing a clock dithering technique. A more detailed example of clock dithering follows later in the discussion.

Second signal $D_{IN}$ may be coupled to delay stage 440. Delay stage 440 may delay $D_{IN}$ to compensate for any delay that occurs during the generation of digital signal $M_{OUT}$. $D_{OUT}$ may represent the delayed second signal $D_{IN}$.

Demodulator 450 may be a single-bit MDAC, a multi-bit MDAC, or any other type of digital-to-analog converter. In FIG. 4, demodulator 450 may be a single-bit MDAC. Demodulator 450 has a first input coupled to $M_{OUT}$, which may serve as the control signal for demodulator 450. Demodulator 450 also has a second input coupled to $D_{OUT}$. Delayed signal $D_{OUT}$ may be multiplied with $M_{OUT}$ to generate demodulator 450 product $MD_{OUT}$.

The demodulator topology of the present invention may generate a product (e.g., $MD_{OUT}$) based upon synchronously multiplied $M_{IN}$ and $D_{IN}$ signals which were both sampled on the same clock signal. This synchronous multiplication of signals assures accurate computation of two analog signals for analog computation circuits, power measuring circuits, energy measuring circuits or any other suitable computation circuit. As a result, demodulator 450 output $MD_{OUT}$ may have a magnitude equal to the product of $D_{OUT}$ and $M_{OUT}$:

$$MD_{OUT} = M_{OUT} \times D_{OUT} \tag{2}$$

$$= \frac{M_{IN\ delayed}}{M_{REF}} \times D_{IN\ delayed}$$

Lowpass filter 460 attenuates the high frequency components associated with $MD_{OUT}$ to provide output $R_{OUT}$, which is equal to the time average of the $MD_{OUT}$ signal. Lowpass filter 460 may be a narrow passband filter, such that the output $R_{OUT}$ is a quasi-static DC voltage that may be expressed as:

$$R_{OUT} = AVG\left(\frac{M_{IN} \times D_{IN}}{M_{REF}}\right) \tag{3}$$

where AVG represents the time average and $R_{OUT}$ is the computational result of inputs $M_{IN}$, $M_{REF}$, and $D_{IN}$. (Equation 3 dropped the delayed notation associated with $M_{IN}$ and $D_{IN}$ in equation 2 because that delay is inconsequential to the time average value of $R_{OUT}$.)

$M_{IN}$, $M_{REF}$, and $D_{IN}$ may, for example, each represent some unit of voltage and $R_{OUT}$ may represent a correctly scaled computation in voltage. The inputs, for example, may have a variation of units (i.e., $M_{IN}$=voltage and $D_{IN}$=current) so that power to a given load may be determined. Moreover, the inputs may be transposed, that is $M_{IN}$ may be current and $D_{IN}$ may be voltage.

Figure 4A:
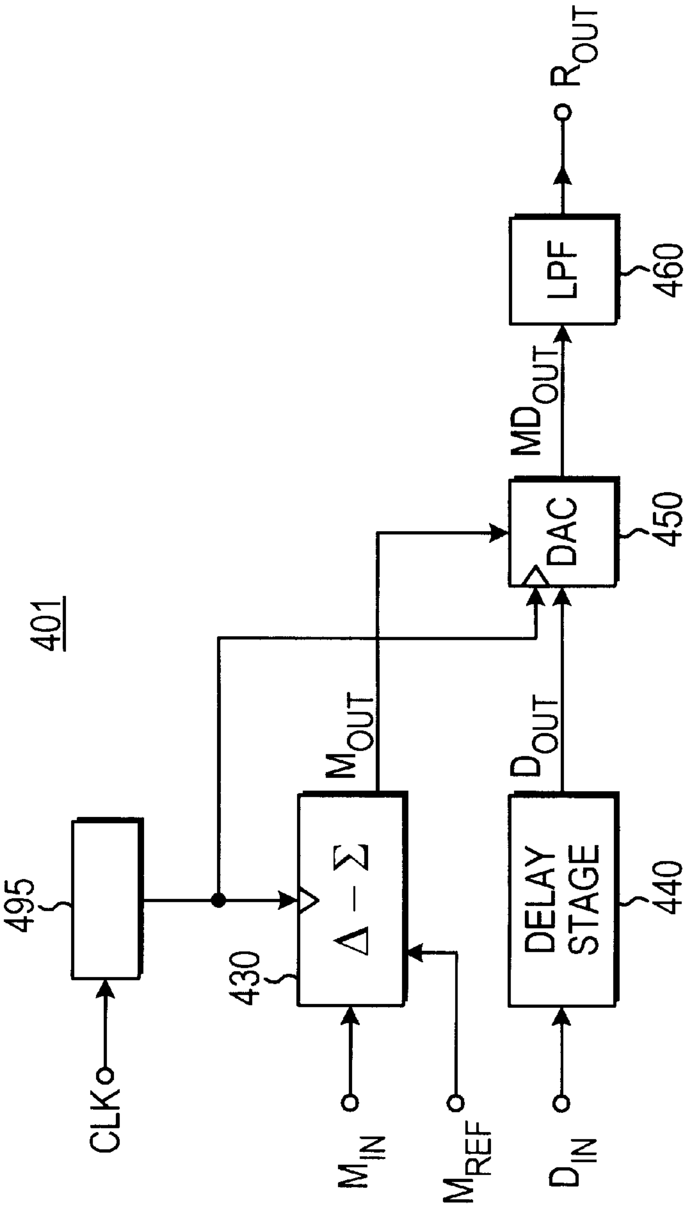
FIG. 4A shows a block diagram of the circuit of FIG. 4 where a clock dithering circuit is used to dither the clock signal applied to the analog computation circuit in accordance with the present invention.

FIG. 4A shows an analog computation circuit 401 similar to that shown in FIG. 4, except that clock dithering circuit 495 (CDC 495) is coupled between clock CLK and a node connected to both modulator 430 and demodulator 450. CDC 495 may dither the sampling clock signal in a random or random-like manner, such that the input frequencies and the sample frequency are highly unlikely to ever be identical, or in an error-prone ratio (i.e., with respect to harmonics). For example, suppose the sample frequency was 60 kHz, input $M_{IN}$ frequency was 59 kHz, and input $D_{IN}$ was 61 kHz. $M_{IN}$ would alias a signal at 1 kHz (|60 kHz−59 kHz|) and $D_{IN}$ would alias a signal at 1 kHz also (|60 kHz−61 kHz|). The product created by multiplier 450 will create two 1 kHz signals in random relative phases. CDC 495 will move those phases around over the time period of lowpass filter 460 so that the fluctuations between constructive and destructive additions will result in no net DC output from lowpass filter 460.

Figure 5:
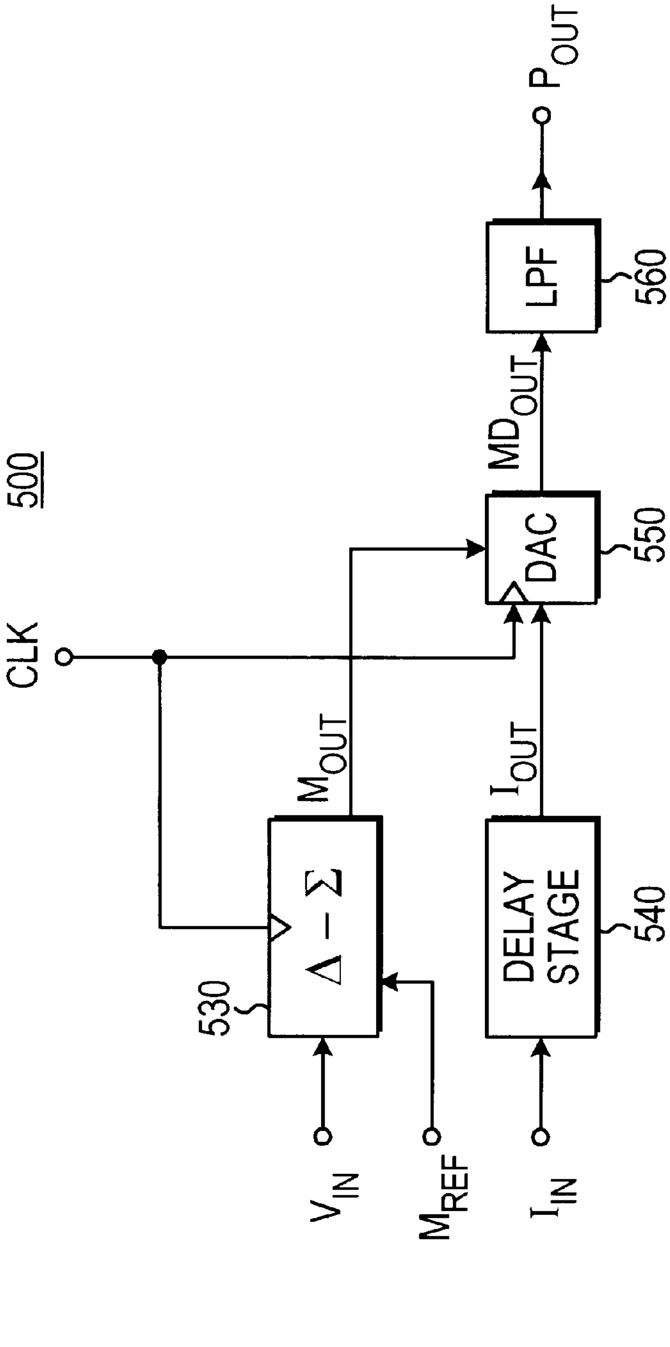
FIG. 5 shows a block diagram of a power measuring circuit constructed in accordance with the present invention.

FIG. 5 shows power measuring circuit 500 which may include modulator 530, delay stage 540, demodulator 550, lowpass filter 560, and clock CLK. Modulator 530 has a first input coupled to $V_{IN}$, a second input coupled to $M_{REF}$ ($M_{REF}$ may be precise so that the power measurement is accurate), and an output $M_{OUT}$. CLK can be coupled to modulator 530 and demodulator 550. Delay stage 540 has input coupled to $I_{IN}$ and output $I_{OUT}$. Demodulator 550 has first input coupled to $M_{OUT}$, second input coupled to $I_{OUT}$, and output $MD_{OUT}$. Lowpass Filter 560 has input coupled to $MD_{OUT}$ and output $P_{OUT}$. Power measuring circuit 500 may operate in the same manner as analog computation circuits 400 and 401 as described above.

Power measuring circuit 500 may have an output proportional to analog inputs $V_{IN}$ and $I_{IN}$ and inversely proportional to $M_{REF}$ which can be expressed as:

$$P_{OUT} = AVG\left(\frac{V_{IN} \times I_{OUT}}{M_{REF}}\right) \quad (4)$$

where $P_{OUT}$ may be the average power consumed by a load.

Figure 6:
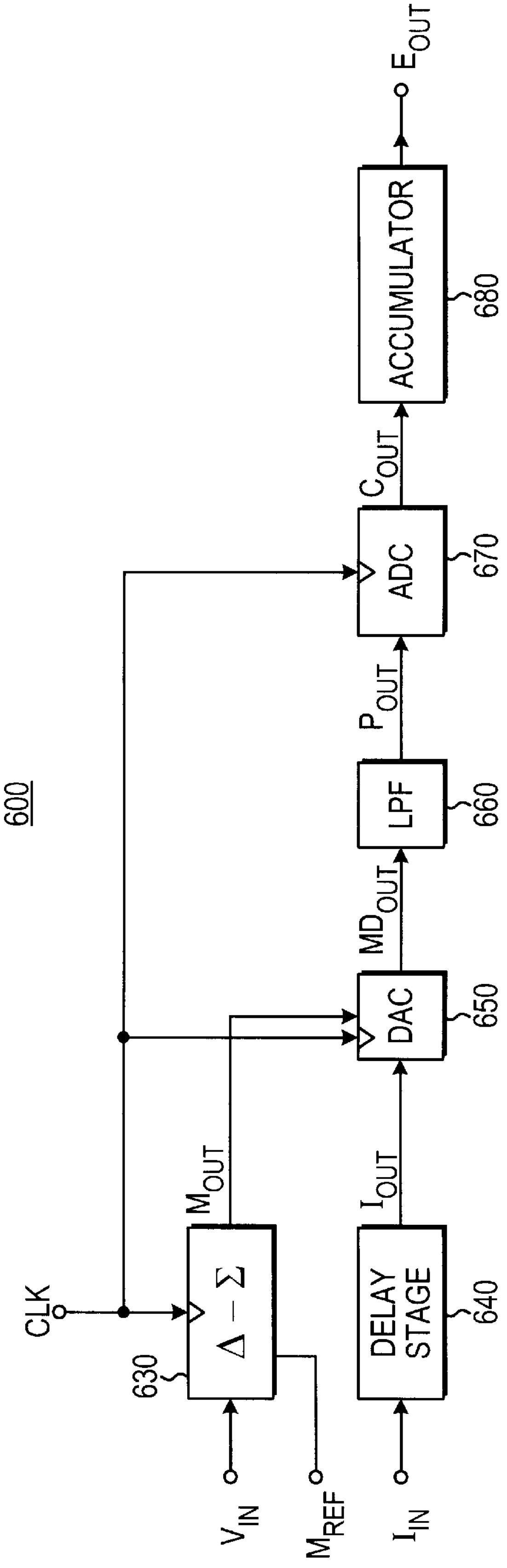
FIG. 6 shows a block diagram of an energy measuring circuit constructed in accordance with the present invention.

FIG. 6 shows an illustrative energy measuring circuit 600 (EMC 600) that may have the same inputs $V_{IN}$, $M_{REF}$, and $I_{IN}$ as power measuring circuit 500. In addition, EMC 600 may have similar components such as modulator 630, delay stage 640, demodulator 650, and lowpass filter 660. Clock CLK is also coupled to both modulator 430 and demodulator 450. Moreover, EMC 600 may have analog-to-digital converter 670 (ADC 670), which may be coupled to lowpass filter output $P_{OUT}$, clock CLK, and has a digital output stream $C_{OUT}$ represented by a series of bits. In addition, EMC 600 may have accumulator 680 which can be coupled to output stream $C_{OUT}$ and has output $E_{OUT}$.

Accumulator 680 may be, for example, a multi-bit adder, that receives a 12-bit input signal (11 magnitude bits plus 1 sign bit), however, in FIG. 6, accumulator 680, as shown, only receives a single-bit input signal. Accumulator 680 may be configured to sample ADC 670 output bit stream over a long period of time (e.g., months, days, hours, minutes, etc.) to determine the amount of energy being delivered to a load. After accumulator 680 has tallied the digitized power bits over a prescribed period of time it may produce average energy output $E_{OUT}$. $E_{OUT}$ may be equal to:

$$E_{OUT}=P_{AVG}\times\text{TIME} \quad (5)$$

where $P_{AVG}$ represents the amount of average power digitized by ADC 670 and TIME represents the period of time accumulator 680 tallied digitized average power bit signals.

Figure 7:
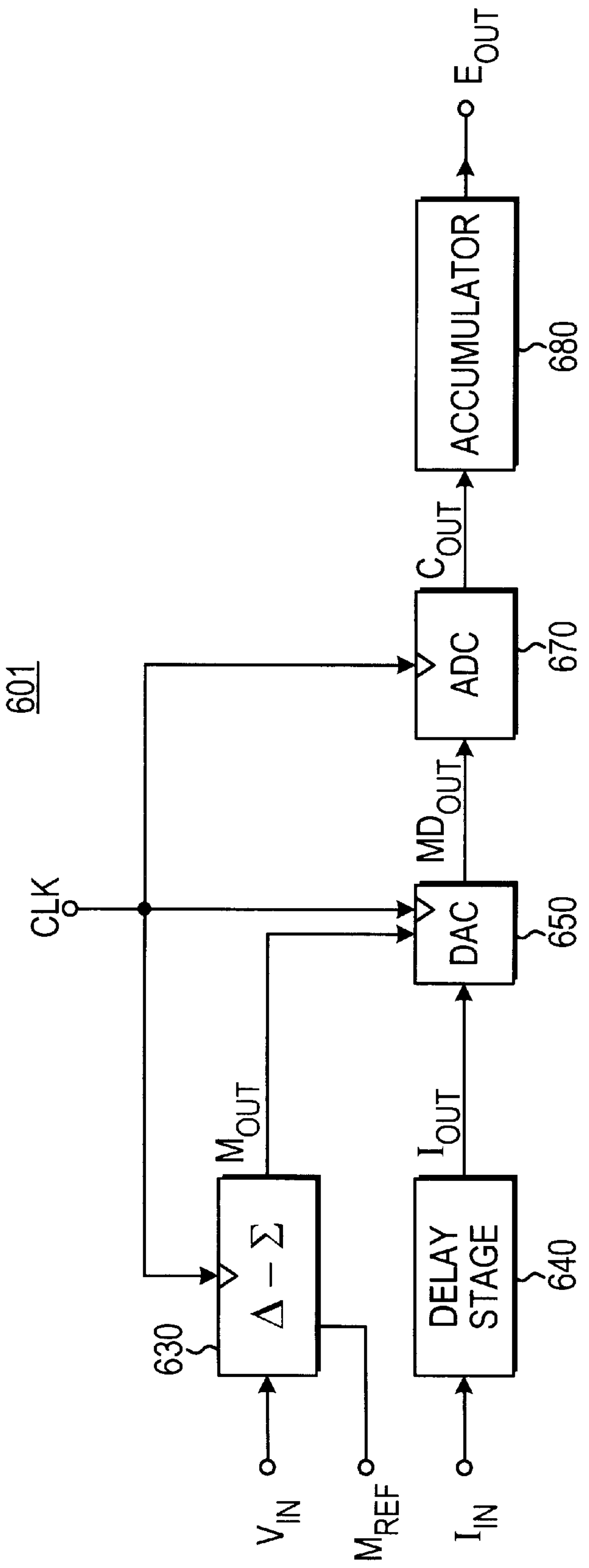
FIG. 7 shows an alternative block diagram of an energy measuring circuit in accordance with the present invention.

FIG. 7 shows another illustrative energy measuring circuit (EMC 601), which has a slight deviation from FIG. 6. In this particular embodiment, lowpass filter 660 has been omitted because accumulator 680 totals the digital bits generated by DAC 670 over a long period of time (e.g., minutes, days, months, etc.), thus forming an extremely low frequency low pass filter that operates entirely in the digital domain. The digital filter may be useful when EMC 601 is used, for example, on a 50 Hz or a 60 Hz. power grid because the average energy consumed by a load can easily be determined with, for example, a 20 KHz sampling rate.

Figure 8:
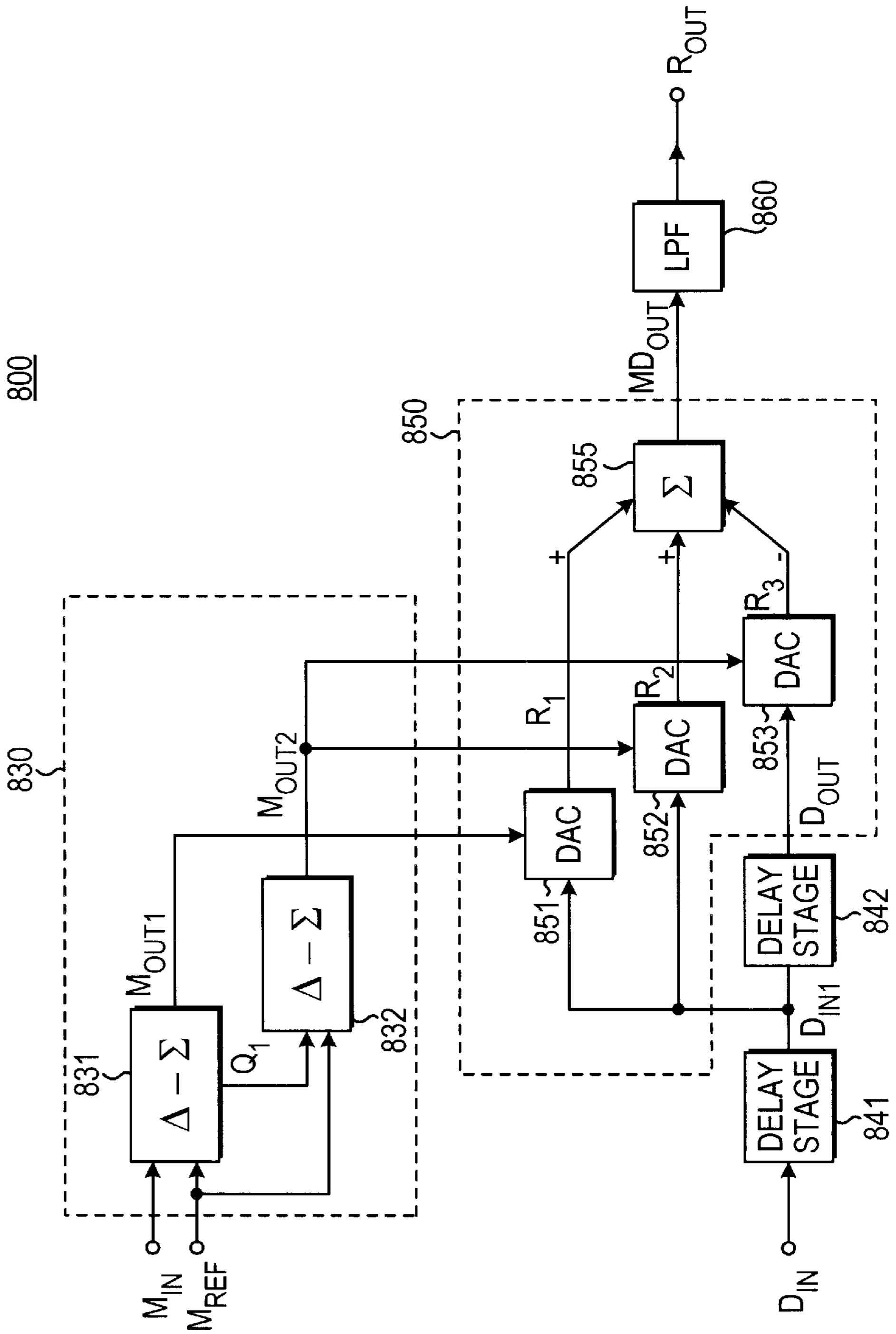
FIG. 8 shows a schematic diagram of a more detailed analog computation circuit using synchronous mash modulator/demodulator topology constructed in accordance with the present invention.

FIG. 8 shows analog computation circuit 800 that uses, for example, synchronous MASH modulator/demodulator circuitry. ACC 800 includes modulator 830, single-sample delay stages 841 and 842, demodulator 850, lowpass filter 860, and gain stage 872. A clock CLK (not shown to prevent cluttering of the FIGURE) can be coupled to modulator 830 and demodulator 850. Modulator 830 includes cascaded single-bit Δ-Σ stages 831 and 832, and demodulator 850 includes single-bit digital-to-analog converters (DAC) stages 851, 852 and 853, and adder/subtractor 855. The number of Δ-Σ stages and DAC stages shown in the FIGURE is merely illustrative. For example, a combination of three Δ-Σ stages and four DAC stages can be used to perform analog computations.

Δ-Σ stage 831 has a first input coupled to $M_{IN}$, a second input coupled to $M_{REF}$, a first output $M_{OUT1}$, and a second output $Q_1$. Δ-Σ stage 831 may generate a quantization error signal that is supplied to Δ-Σ stage 832 via $Q_1$. Δ-Σ stage 832 has a first input coupled to $Q_1$, a second input coupled to $M_{REF}$, and an output $M_{OUT2}$. Delay stage 841 has input coupled to $D_{IN}$ and an output $D_{IN1}$. Delay stage 842 has an input coupled to $D_{IN1}$ and an output $D_{OUT}$. DAC stage 851 has first input coupled to $M_{OUT1}$, a second input coupled to $D_{IN1}$, and an output $R_1$. DAC stage 852 has a first input coupled to $M_{OUT2}$, a second input coupled to $D_{IN1}$, and an output $R_2$. DAC stage 153 has a first input coupled to $M_{OUT2}$, a second input coupled to $D_{OUT}$ and an output $R_3$. Adder/Subtractor 155 has inputs coupled to $R_1$, $R_2$, and $R_3$, and has output $MD_{OUT}$. Lowpass filter has input coupled to $MD_{OUT}$ and has output $R_{OUT}$.

The following discussion describes how ACC 800 utilizes synchronous MASH modulator/demodulator topology.

Each Δ-Σ stage has an input coupled to a clock CLK. Clock CLK has a signal (i.e.,frequency) that is much higher (e.g., 10 to $10^{12}$ times higher) than the frequency of the reference signal fed to pulse modulator 830.

Δ-Σ stage 831 provides digitized quantized output $M_{OUT1}$ which has a ratio equal to:

$$M_{OUT1}[i] = \frac{M_{IN}[i-1] + e[i] - e[i-1]}{M_{REF}} \quad (6)$$

where index i denotes the sample index and e[i] (produced by Δ-Σ stage 831) is the quantization error of Δ-Σ stage 831. Thus $M_{OUT1}$ equals the desired ratio of the input $M_{IN}$ divided by $M_{REF}$, plus the spectrally-shaped quantization error of Δ-Σ stage 831 divided by $M_{REF}$.

Δ-Σ stage 832 provides digitized quantized output $M_{OUT2}$ equal to:

$$M_{OUT2}[i] = \frac{e[i-1] + e'[i] - e'[i-1]}{M_{REF}} \quad (7)$$

where e'[i] the quantization error of Δ-Σ stage 832 (produced internally withing Δ-Σ stage 832).

In an alternative approach, the single-bit Δ-Σ stages 831 and 832 of modulator 830 can produce different signals than that described in conjunction with the illustration shown in FIG. 8. For example, Δ-Σ stage 831 may produce an integrator voltage for $Q_1$. Δ-Σ stage 832, on the other hand, may internally reproduce the quantization error of Δ-Σ stage 831. The integrator voltage can be supplied from an integrator located within Δ-Σ stage 831. This is illustrated, for example, in an illustrative Δ-Σ analog-to-digital converter 970 shown in FIG. 9. Integrator 971 can have output $R_{SI}$, which can be supplied to Δ-Σ stage 832 via $Q_1$. A more detailed discussion of Δ-Σ analog-to-digital converter 970 is described below in connection with the embodiment associated with FIG. 9.

Single-bit DACs 851, 852 and 853 multiply digital signals $M_{OUT1}$ and $M_{OUT2}$ to delayed second input signals $D_{IN1}$ and $D_{OUT}$ to provide outputs $R_1$, $R_2$ and $R_3$, respectively, equal to:

$$R_1[i]=D_{IN}[i-1]\times M_{OUT1}[i] \quad (8)$$

$$R_2[i]=D_{IN}[i-1]\times M_{OUT2}[i] \quad (9)$$

$$R_3[i]=D_{IN}[i-2]\times M_{OUT2}[i] \quad (10)$$

where $R_1$, $R_2$ and $R_3$ each may represent a product signal of a digital signal (e.g., $M_{OUT1}$ or $M_{OUT2}$) and a delayed input signal (e.g., $D_{IN1}$ or $D_{OUT}$) sampled on the same clock signal.

Adder/subtractor 855 provides an output $MD_{OUT}$ equal to:

$$MD_{OUT}[i]=R_1[i]+R_2[i]-R_3[i] \tag{11}$$

which equals:

$$MD_{OUT}[i]=\frac{D_{IN}[i-1]}{M_{REF}}\times(M_{IN}[i-1]+e[i]+e'[i]-e'[i-1])-\frac{D_{IN}[i-2]}{M_{REF}}\times(e[i-1]+e'[i]-e'[i-1]) \tag{12}$$

Note that:

$$MD_{OUT}[i+1]=\frac{D_{IN}[i]}{M_{REF}}\times(M_{IN}[i]+e[i+1]+e'[i+1]-e'[i])-\frac{D_{IN}[i-1]}{M_{REF}}\times(e[i]+e'[i+1]-e'[i]) \tag{13}$$

If the time constant of lowpass filter 860 is much greater than the sample period of $MD_{OUT}$[i] (e.g., 10,000 times), lowpass filter 860 provides output $R_{OUT}$ that is the average of $MD_{OUT}$. $R_{OUT}$ as a function of $M_{IN}$[i−1] and $D_{IN}$[i−1] approximately equals:

$$\begin{aligned}R_{OUT}\Big|[i-1] &\approx \frac{D_{IN}[i-1]}{M_{REF}}\times(M_{IN}[i-1]+e[i]+e'[i]-e'[i-1])-\frac{D_{IN}[i-1]}{M_{REF}}\times(e[i]+e'[i+1]-e'[i]) \\ &= \frac{D_{IN}[i-1]\times M_{IN}[i-1]}{M_{REF}}+\frac{D_{IN}[i-1]}{M_{REF}}(2e'[i]-e'[i-1]-e'[i-1]-e'[i-1])\end{aligned} \tag{14}$$

The first term on the right side of equation (14) is the desired output, and the second term equals the second-order spectrally-shaped quantization noise of Δ-Σ stage 832, which are substantially reduced by lowpass filter 860. Furthermore, because e' is uncorrelated with $D_{IN}$, the DC average of the product of e' and $D_{IN}$ equals zero. As a result, $R_{OUT}$ approximately equals:

$$R_{OUT}=\frac{M_{IN}\times D_{IN}}{M_{REF}} \tag{15}$$

Thus output $R_{OUT}$ of ACC 800 is proportional to input $M_{IN}$, and input $D_{IN}$ and inversely proportional to reference input $M_{REF}$. Persons skilled in the art may appreciate that ACC 800 of FIG. 8 can easily be configured to be a power measuring circuit and/or an energy measuring circuit. For example, if $M_{IN}$, and $D_{IN}$ are substituted with $V_{IN}$, and input $I_{IN}$ respectively, equation (15) may be expressed as:

$$P_{OUT}=\frac{M_{IN}\times D_{IN}}{M_{REF}} \tag{16}$$

wherein $P_{OUT}$ is the average power measured by ACC 800.

Figure 9:
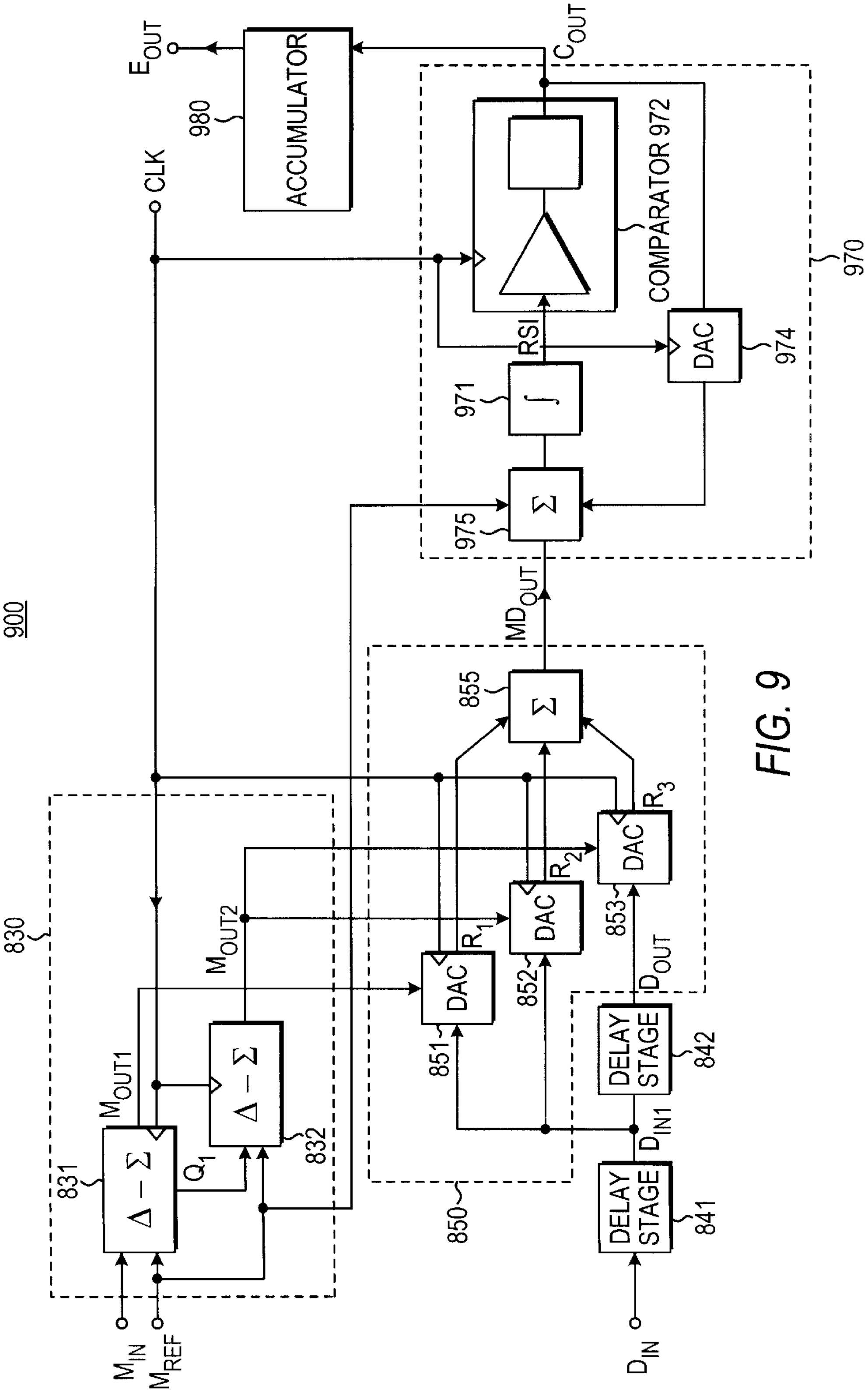
FIG. 9 shows a schematic diagram of a more detailed energy measuring circuit using synchronous mash modulator/demodulator topology constructed in accordance with the present invention.

FIG. 9 illustrates energy measuring circuit 900 (EMC 900) using the same synchronous MASH modulator/demodulator topology as that previously discussed in FIG. 8. In addition to the components illustrated in FIG. 8, EMC 900 may include ADC 970, and accumulator 980. Analog-to-digital converter 970 (ADC 970) has input coupled to $MD_{OUT}$ and output $C_{OUT}$. Accumulator 980 has input coupled to $C_{OUT}$ and has output $E_{OUT}$. Clock CLK is shown to be coupled to Δ-Σ stages 831 and 832 of modulator 830, DAC stages 851, 852 and 853 of demodulator 850, and comparator 972 and DAC 974 of ADC 970.

ADC 970 may be any type of suitable analog-to-digital converter. For instance, ADC 970 may be a Δ-Σ ADC as illustrated in the FIGURE. ADC 970 can include integrator 971, comparator circuit 972, DAC 974, and adder/subtracter 975. Adder/subtractor 975 has a first input coupled to $MD_{OUT}$, a second input coupled to DAC 974 output $R_4$, and an output coupled to integrator 971. Integrator 971 has a first input coupled to the output of adder/subtractor 975, a second input coupled to $M_{REF}$, and has output $R_{SI}$. Comparator 972 has a first input coupled to clock signal CLK, a second input coupled to $R_{SI}$ and an output $C_{OUT}$. Clock signal CLK may be the same clock signal applied to modulator 830 (more particularly Δ-Σ stages 831 and 832) for setting the sampling frequency. Comparator 972 compares the output of integrator 971 to reference level (e.g., ground), not shown, and latches the comparison result as output signal $C_{OUT}$. DAC 974 has input coupled to output of comparator 972. DAC 974 converts digital output signal $C_{OUT}$ to analog signal $R_4$ which may be fed to the second input of adder/subtractor 975 as negative feedback. In an alternative embodiment, analog signal $R_4$ can be fed back to adder/subtractor 955. Such an alternative arrangement may eliminate adder/subtractor 975.

As the output of adder/subtractor 855, $MD_{OUT}$ is fed to ADC 970, the analog signal representing the average power $P_{AVG}$ may be converted into at least a single-bit digital output stream that is tallied by accumulator 980. Accumulator 980 totals the average amount of power bits measured over a certain interval of time (e.g., months, days, hours, minutes). After accumulator 980 has tallied the digitized power bits over a prescribed period of time it may output $E_{OUT}$, which represents the average amount of energy measured during the prescribed period of time. $E_{OUT}$ may be equal to:

$$E_{OUT}=P_{AVG}\times\text{TIME} \tag{17}$$

where $P_{AVG}$ represents the amount of average power (joules/seconds) digitized by ADC 970 and TIME represents the period of time (seconds) accumulator 980 tallied the digitized average power bits.

Persons skilled in the art will recognize that the apparatus of the present invention may be implemented using circuit configurations other than those shown and discussed above. For example, MDAC 851, 852, and 853 can be separate and distinct hardware elements, the same hardware elements used in a time interleaved manner, or a combination thereof. In another example, the embodiments of the present invention can have differential circuitry used throughout. Such a configuration provides analog computation circuitry with the ability to synchronously multiply differential input signals (e.g., differential $V_{IN}$ and differential $I_{IN}$). It will also be understood that the delay time of signals provided to the modulator and/or demodulator can be modified. Such modifications can be realized by altering the number of delay stages placed in the signal path (i.e., increase or decrease the number of delay stages used), by using delay stages that have variable delay times, or by using any other suitable configuration. Modifying the delay time can be used to compensate for external delays that skew at least one of the input signals (e.g., $M_{IN}$ or $D_{IN}$) in time. For example, when measuring power and energy, an external delay can occur when a transformer is used to measure current or when any other AC coupling is used to measure a signal. All such modifications are within the scope of the present invention, which is limited only by the claims that follow.

What is claimed is:

1. Analog computation circuitry that generates an output signal at an output node proportional to a first input signal at a first input node, a second input signal at a second input node, and inversely proportional to a reference signal at a reference node, said circuit comprising:

modulation circuitry that samples said first input signal and said reference signal based on a clock signal, said modulation circuitry generating at least one digital output signal;

delay circuitry that delays said second input signal by generating at least one delayed second signal;

demodulation circuitry that receives said at least one delayed second input signal and said at least one digital signal, said demodulation circuitry generating a product signal based on said at least one digital output signal and said delayed second signal; and output circuitry that receives said product signal, said output circuitry generates said output signal.

2. The circuitry of claim 1, wherein said modulator circuitry comprises:

a pulse code modulator circuit.

3. The circuitry of claim 2, wherein said pulse code modulator circuit comprises:

a Δ-Σ pulse code modulator circuit.

4. The circuitry of claim 2, wherein said pulse code modulator circuit comprises:

a plurality of Δ-Σ pulse code modulator circuits cascaded together.

5. The circuitry of claim 1, wherein said reference signal is at a frequency that is substantially less than said clock signal.

6. The circuitry of claim 1, wherein said clock signal is generated by a clock dithering circuit that dithers said clock signal.

7. The circuitry of claim 1, wherein said reference signal is a non-zero value.

8. The circuitry of claim 1, wherein said circuit comprises an analog computation circuit.

9. The circuitry of claim 8, wherein said first input signal comprises:

a first numerical signal.

10. The circuitry of claim 8, wherein said second input signal comprises:

a second numerical signal.

11. The circuitry of claim 8, wherein said output circuitry comprises:

a low pass filter.

12. The circuitry of claim 8, wherein said output signal comprises:

a numerical output signal.

13. The circuitry of claim 1, wherein said circuitry comprises:

a power measuring circuit.

14. The circuitry of claim 1, wherein said circuitry comprises:

an energy measuring circuit.

15. The circuitry of claim 1, wherein said output circuitry comprises:

a lowpass filter having a filtered output;

analog-to-digital converter circuitry that samples said filtered output based on said clock signal, and that generates a bit stream; and an accumulator coupled to receive said bit stream, that accumulates said bit stream for a period of time to generate said output signal.

16. The circuitry of claim 1, wherein said output circuitry comprises:

analog-to-digital converter circuitry that samples said product signal based on said clock signal, and that generates a bit stream; and accumulator circuitry that samples said bit stream, that accumulates said bit stream for a period of time to generate said output signal.

17. The circuitry of claim 1, wherein said second signal of said demodulation circuitry is delayed such that said at least one digital signal and said at least one delayed second signal are based on said clock signal.

18. An analog computation circuit having a first and second input signal, a reference signal, a clock signal, and an output signal, said circuit comprising:

a modulator, coupled to receive said first input signal and said reference signal, that generates at least one digital output signal based on said first input signal and said reference signal;

a delay stage, coupled to receive said second input signal, which generates at least one delayed signal, that compensates for delay caused by said generation of said at least one digital output signal;

a demodulator, coupled to receive said at least one said delayed signal and said at least one digital output signal, said demodulator generates a product signal based on said delayed signal and said digital output signal; and an output circuit, coupled to receive said product signal to produce said output signal.

19. The circuit of claim 18, wherein said modulator circuit comprises:

a pulse code modulator circuit.

20. The circuit of claim 18, wherein said pulse code modulator circuit comprises:

a Δ-Σ pulse code modulator circuit.

21. The circuit of claim 18, wherein said pulse code modulator circuit comprises:

a plurality of Δ-Σ pulse code modulator circuits cascaded together.

22. The circuit of claim 18, wherein said reference signal is at a frequency substantially lower than said clock signal.

23. The circuit of claim 18, wherein said clock signal is generated by a clock dithering circuit that dithers said clock signal.

24. The circuit of claim 18, wherein said circuit comprises:

an arithmetic circuit.

25. The circuit of claim 18, wherein said first input signal comprises:

a first numerical signal.

26. The circuit of claim 18, wherein said second input signal comprises:

a second numerical signal.

27. The circuit of claim 18, wherein said output filter comprises:

a low pass filter.

28. The circuit of claim 18, wherein said output filter attenuates high frequency components of said product signal.

29. The circuit of claim 18, wherein said output signal comprises:

a numerical output signal.

30. The circuit of claim 18, wherein said circuit comprises:

a power measuring circuit.

31. The circuit of claim 18, wherein said circuit comprises:

an energy measuring circuit.

32. The circuit of claim 18, wherein said output filter comprises:

a lowpass filter having a filtered output;

analog-to-digital converter circuitry that samples said filtered output based on said clock signal, and that generates a bit stream; and an accumulator coupled to receive said bit stream, that accumulates said bit stream for a period of time to generate said output signal.

33. The circuit of claim 18, wherein said output circuit comprises:

analog-to-digital converter circuitry that samples said product output based on said clock signal, and that generates a bit stream; and accumulator circuitry that samples said bit stream, that accumulates said bit stream for a period of time to generate said output signal.

34. The circuit of claim 18, wherein said second input signal of said demodulator is delayed such that said at least one digital signal and said at least one delayed second signal are based on said clock signal.

35. A method for generating an output signal based on first and second input signals and a reference signal, said method comprising:

modulating said first input signal with respect to said reference signal to generate at least one digital output signal;

delaying said second input signal to generate at least one delayed second input signal to compensate for delay caused by said generation of said at least one digital output signal;

demodulating said at least one digital output signal and said at least one delayed second input signal to produce a product signal; and processing said product signal to generate said output signal.

36. The method of claim 35, wherein said generated output signal comprises: a selection from the group consisting of an arithmetic result, a power measurement, an energy measurement, and a combination thereof.

37. The method of claim 35, wherein said modulating comprises:

sampling said first input signal and said reference signal at a substantially faster rate than a reference signal frequency.

38. The method of claim 35, wherein said demodulating comprises:

multiplying said at least one delayed second input signal and said at least one digital signal such that said at least one delayed second input signal and said at least one digital signal are based on a same clock signal to produce said product signal.

39. The method of claim 35, wherein said demodulating comprises:

sampling said at least one digital output signal and said at least one second input signal at a substantially faster rate than a reference signal frequency.

40. The method of claim 35, wherein said processing comprises:

filtering out high frequency components associated with said product signal.

41. The method of claim 35, wherein said processing comprises:

converting said product signal to a digital bit stream for accumulation in an accumulator.

* * * * *